United States Patent
Fang

(10) Patent No.: US 8,520,403 B2
(45) Date of Patent: Aug. 27, 2013

(54) MULTI-LAYER SEMICONDUCTOR ELEMENT PACKAGE STRUCTURE WITH SURGE PROTECTION FUNCTION

(76) Inventor: Wei-Kuang Fang, Taipei (TW)

( * ) Notice: Subject to any disclaimer, the term of this patent is extended or adjusted under 35 U.S.C. 154(b) by 496 days.

(21) Appl. No.: 12/777,596

(22) Filed: May 11, 2010

(65) Prior Publication Data

US 2011/0220402 A1    Sep. 15, 2011

(30) Foreign Application Priority Data

Mar. 10, 2010  (TW) .............................. 99106892 A

(51) Int. Cl.
*H05K 1/11* (2006.01)
*H05K 1/14* (2006.01)

(52) U.S. Cl.
USPC ............ 361/803; 361/765; 361/766; 361/118

(58) Field of Classification Search
USPC .......... 361/118–120, 760–766, 803, 823–824
See application file for complete search history.

(56) References Cited

U.S. PATENT DOCUMENTS

| 6,867,436 B1 * | 3/2005 | Matteson et al. ............. 257/106 |
| 2004/0092292 A1 * | 5/2004 | Muto et al. ................. 455/562.1 |
| 2007/0019353 A1 * | 1/2007 | Ishii et al. ..................... 361/118 |
| 2007/0285855 A1 * | 12/2007 | Kiuchi et al. ................... 361/56 |

* cited by examiner

*Primary Examiner* — Tuan T Dinh
(74) *Attorney, Agent, or Firm* — Muncy, Geissler, Olds & Lowe, PLLC

(57) ABSTRACT

A multi-layer semiconductor element package structure with surge protection function includes a substrate unit, an insulated unit, a one-way conduction unit and a protection unit. The substrate unit has at least one top substrate, at least one middle substrate and at least one bottom substrate. The insulated unit has at least one first insulated layer filled between the top substrate and the middle substrate and at least one second insulated layer filled between the middle substrate and the bottom substrate. The one-way conduction unit has a plurality of one-way conduction elements electrically disposed between the top substrate and the middle substrate and enclosed by the first insulated layer. The protection unit has at least one protection element with anti surge current or anti surge voltage function electrically disposed between the middle substrate and the bottom substrate and enclosed by the second insulated layer.

11 Claims, 10 Drawing Sheets

MULTI-LAYER SEMICONDUCTOR ELEMENT PACKAGE STRUCTURE WITH SURGE PROTECTION FUNCTION

BACKGROUND OF THE INVENTION

1. Field of the Invention

The present invention relates to a semiconductor element package structure and a method for manufacturing the same, and more particularly, to a multi-layer semiconductor element package structure with surge protection function and a method for manufacturing the same.

2. Description of Related Art

Future electronic products have the requirement of being light, thin, short, and small. Moreover, the size of passive electronic components in those products is becoming larger than that of the other components. Hence, if the discrete elements can be effectively integrated, the electronic product can achieve the quality of being light, thin, short and small.

The discrete elements such as solid state diodes are widely used on a lot of electronic devices. Each solid state diode has a positive terminal and a negative terminal corresponding to each other. Voltage and current presented between them have non-linear characteristics. One type of diode has one way conductive characteristic, and can transform AC power to DC power to achieve rectification effect so that a power supply can output steady DC power. Such type of diode also is called rectifying diode or rectifier. It has been adopted in a wide variety of applications, such as information, communication, consumer electronic, aviation and space exploration, medical, motor vehicles, business equipment and the like.

However, each discrete element only has a single function in the related design. Hence, when a designer needs to use many different functions for protecting the electronic product, the designer only can place many discrete elements with a single function in the electronic product. Therefore, the method of the related art wastes cost and occupies much space in the electronic product.

SUMMARY OF THE INVENTION

In view of the aforementioned issues, the present invention provides a multi-layer semiconductor element package structure to create many receiving spaces for receiving discrete elements in order to generate surge protection function.

In view of the aforementioned issues, the present invention provides a method for manufacturing a multi-layer semiconductor element package structure to create many receiving spaces for receiving discrete elements in order to generate surge protection function.

To achieve the above-mentioned objectives, the present invention provides a multi-layer semiconductor element package structure with surge protection function, including: a substrate unit, an insulated unit, a one-way conduction unit and a protection unit. The substrate unit has at least one top substrate, at least one middle substrate and at least one bottom substrate. The insulated unit has at least one first insulated layer filled between the at least one top substrate and the at least one middle substrate and at least one second insulated layer filled between the at least one middle substrate and the at least one bottom substrate. The one-way conduction unit has a plurality of one-way conduction elements electrically disposed between the at least one top substrate and the at least one middle substrate and enclosed by the at least one first insulated layer. The protection unit has at least one protection element with anti surge current or anti surge voltage function electrically disposed between the at least one middle substrate and the at least one bottom substrate and enclosed by the at least one second insulated layer.

To achieve the above-mentioned objectives, the present invention provides a method for manufacturing a multi-layer semiconductor element package structure with surge protection function, including: providing a substrate unit that has at least one top substrate, at least one middle substrate and at least one bottom substrate; electrically placing a plurality of one-way conduction elements between the at least one top substrate and the at least one middle substrate and electrically placing a plurality of protection elements with anti surge current or anti surge voltage function between the at least one middle substrate and the at least one bottom substrate; filling at least one first insulated layer between the at least one top substrate and the at least one middle substrate and filling at least one second insulated layer between the at least one middle substrate and the at least one bottom substrate; forming a plurality of through holes through the substrate unit, wherein each through hole passes through the at least one top substrate, the at least one first insulated layer, the at least one middle substrate, the at least one second insulated layer and the at least one bottom substrate in sequence; forming a plurality of conductive layers on inner surfaces of the through holes, wherein each conductive layer is electrically connected to the at least one top substrate, the at least one middle substrate and the at least one bottom substrate; and then cutting the substrate unit, the at least one first insulated layer and the at least one second insulated layer in order to form a plurality of single semiconductor element package structures, wherein at least one of the one-way conduction elements and at least one of the protection elements are packaged in each single semiconductor element package structure.

Therefore, there is a receiving space shown between the top substrate and the middle substrate for receiving the one-way conduction elements that are enclosed by the first insulated layer, and there is another receiving space shown between the middle substrate and the bottom substrate for receiving at least one of the protection elements that is enclosed by the second insulated layer, so that the present invention can solve the above-mentioned problems in the related art.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1A:
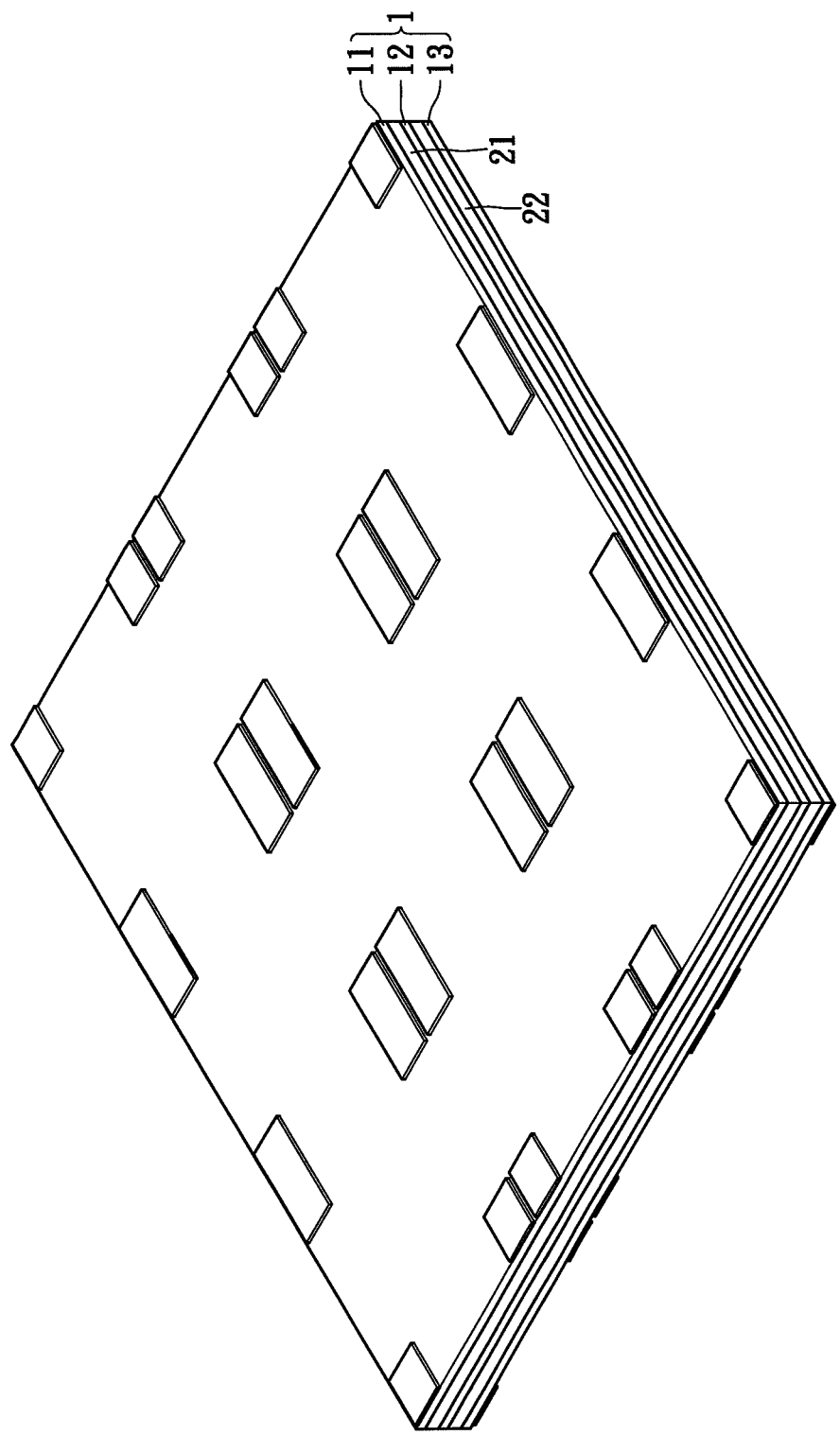
FIGS. 1A to 1D are perspective, schematic views of the method for manufacturing a multi-layer semiconductor element package structure with surge protection function according to the first embodiment of the present invention, at different stages of the manufacturing processes, respectively.

Referring to FIGS. 1A to 1D, the present invention provides a method for manufacturing a multi-layer semiconductor element package structure with surge protection function, including the following steps:

The step S100 is that: referring to FIG. 1A, providing a substrate unit 1 that has at least one top substrate 11, at least one middle substrate 12 and at least one bottom substrate 13. In addition, the top substrate 11 has a plurality of conductive pad (shown as many top protrusions on the topmost surface of the substrate unit 1) and a plurality of conductive tracks respectively disposed on the top surface and the bottom surface of the top substrate 11. The middle substrate 12 has a plurality of conductive tracks disposed on the top surface and the bottom surface of the middle substrate 12. The bottom substrate 13 has a plurality of conductive tracks and a plurality of conductive pad (shown as many bottom protrusions that are disposed on the bottommost surface of the substrate unit 1 and respectively correspond to the top protrusions) respectively disposed on the top surface and the bottom surface of the top substrate 11. The above-mentioned conductive pads and the conductive tracks are formed by printing or any forming method.

The step S102 is that: referring to FIG. 1A, electrically placing a plurality of one-way conduction elements (not shown) between the at least one top substrate 11 and the at least one middle substrate 12 and electrically placing a plurality of protection elements (such as varistors, but not shown) with anti surge current or anti surge voltage function between the at least one middle substrate 12 and the at least one bottom substrate 13.

The step S104 is that: referring to FIG. 1A, filling at least one first insulated layer 21 between the at least one top substrate 11 and the at least one middle substrate 12 and filling at least one second insulated layer 22 between the at least one middle substrate 12 and the at least one bottom substrate 13. In addition, after the first insulated layer 21 and the second insulated layer 22 have been filled, the top substrate 11, the first insulated layer 21, the middle substrate 12, the second insulated layer 22 and the bottom substrate 13 are stacked onto each other in sequence from top to bottom. The one-way conduction elements (not shown) are fully enclosed by the first insulated layer 21 and the protection elements (not shown) are fully enclosed by the second insulated layer 22.

Figure 1B:
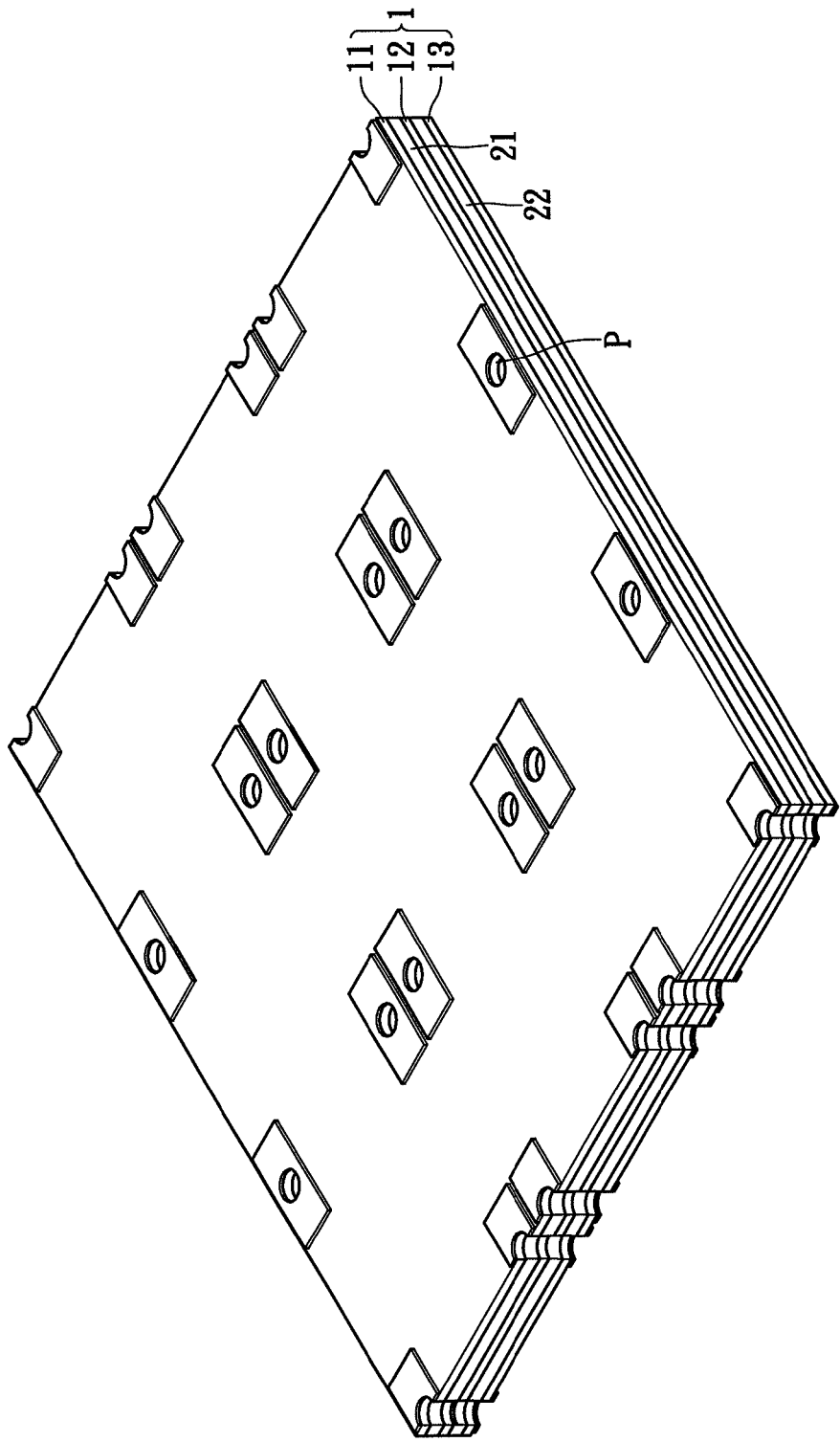

The step S106 is that: referring to FIG. 1B, forming a plurality of through holes P through the substrate unit 1; wherein each through hole P passes through the at least one top substrate 11, the at least one first insulated layer 21, the at least one middle substrate 12, the at least one second insulated layer 22 and the at least one bottom substrate 13 in sequence. In addition, the conductive pads and the conductive tracks are simultaneously penetrated by the through holes P.

Figure 1C:
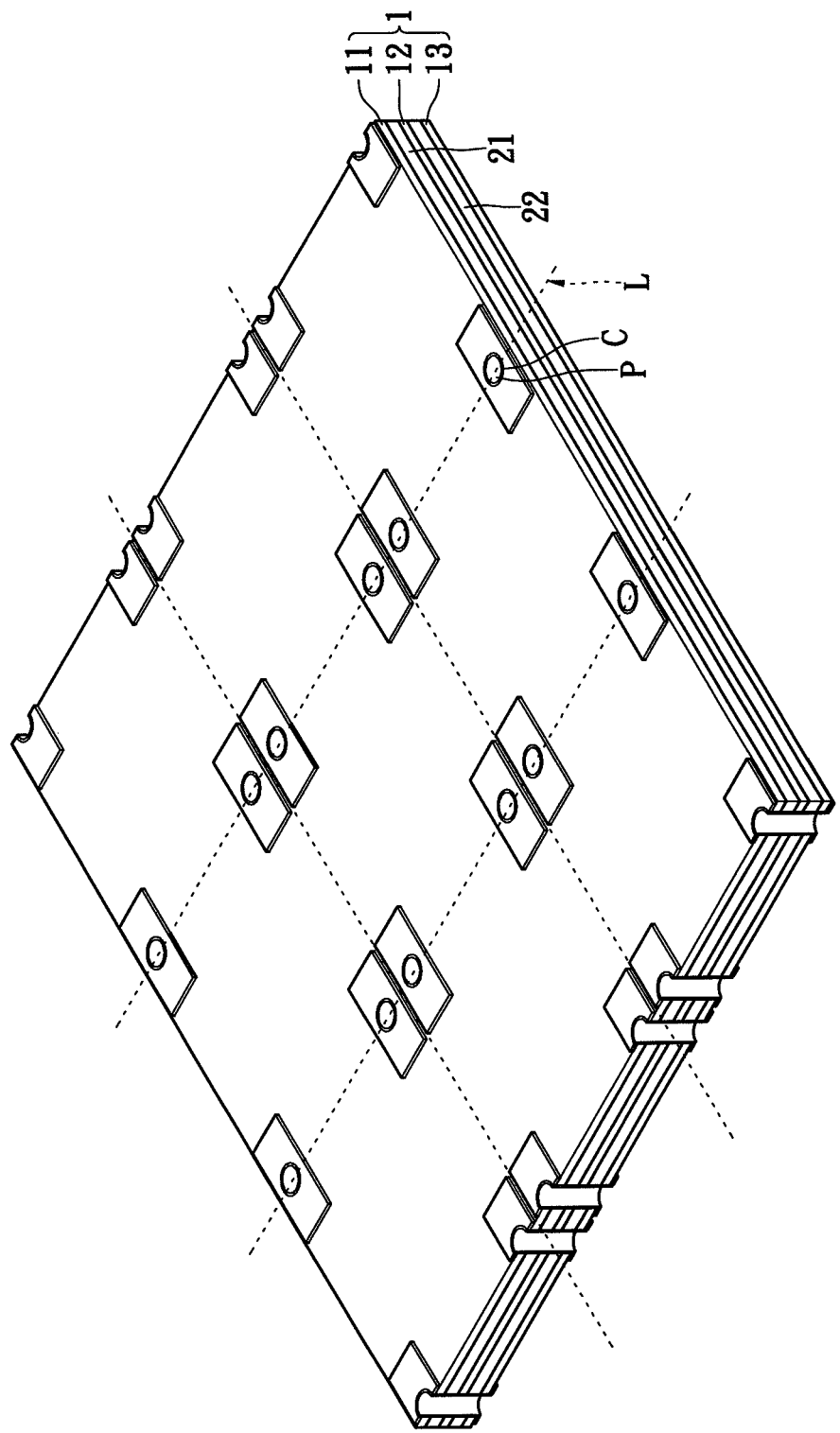

The step S108 is that: referring to FIG. 1C, forming a plurality of conductive layers C on inner surfaces of the through holes P; wherein each conductive layer C is electrically connected to the at least one top substrate 11, the at least one middle substrate 12 and the at least one bottom substrate 13. In other words, the conductive layers C are formed on the inner surfaces of the through holes P, so that the top substrate 11, the middle substrate 12 and the bottom substrate 13 are electrically connected to each other by each conductive layer C. Hence, the conductive pads and the conductive tracks may selectively connect to each other.

Figure 1D:
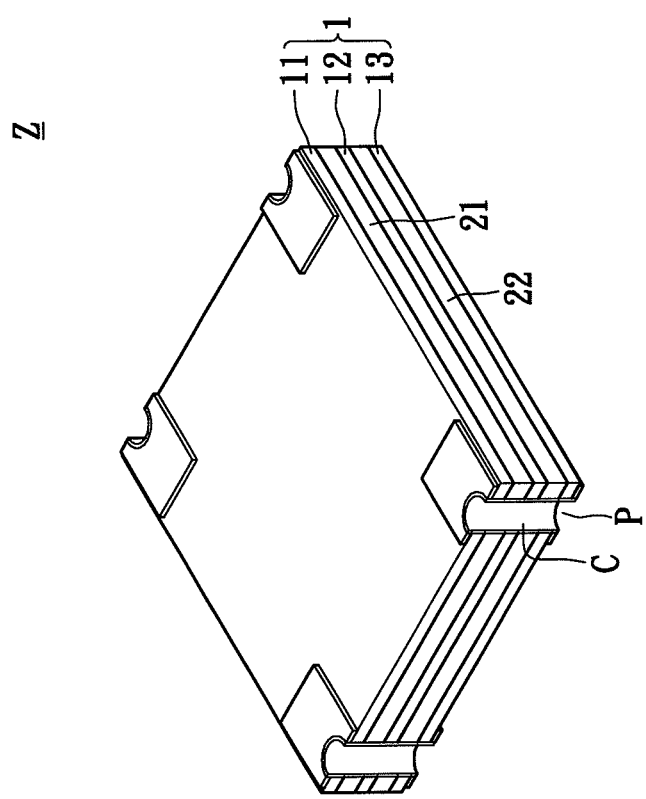

The step S110 is that: referring to FIGS. 1C and 1D, cutting the substrate unit 1, the at least one first insulated layer 21 and the at least one second insulated layer 22 along cutting lines L as shown in FIG. 1C in order to form a plurality of single semiconductor element package structures Z (FIG. 1D shows one of the single semiconductor element package structure Z); wherein at least one of the one-way conduction elements and at least one of the protection elements are packaged in each single semiconductor element package structure Z. In other words, the conductive pads and the conductive tracks may be selectively disposed on different positions of the substrate unit 1, and each single semiconductor element package structure Z may includes one or more one-way conduction elements and one or more protection elements.

Figure 2A:
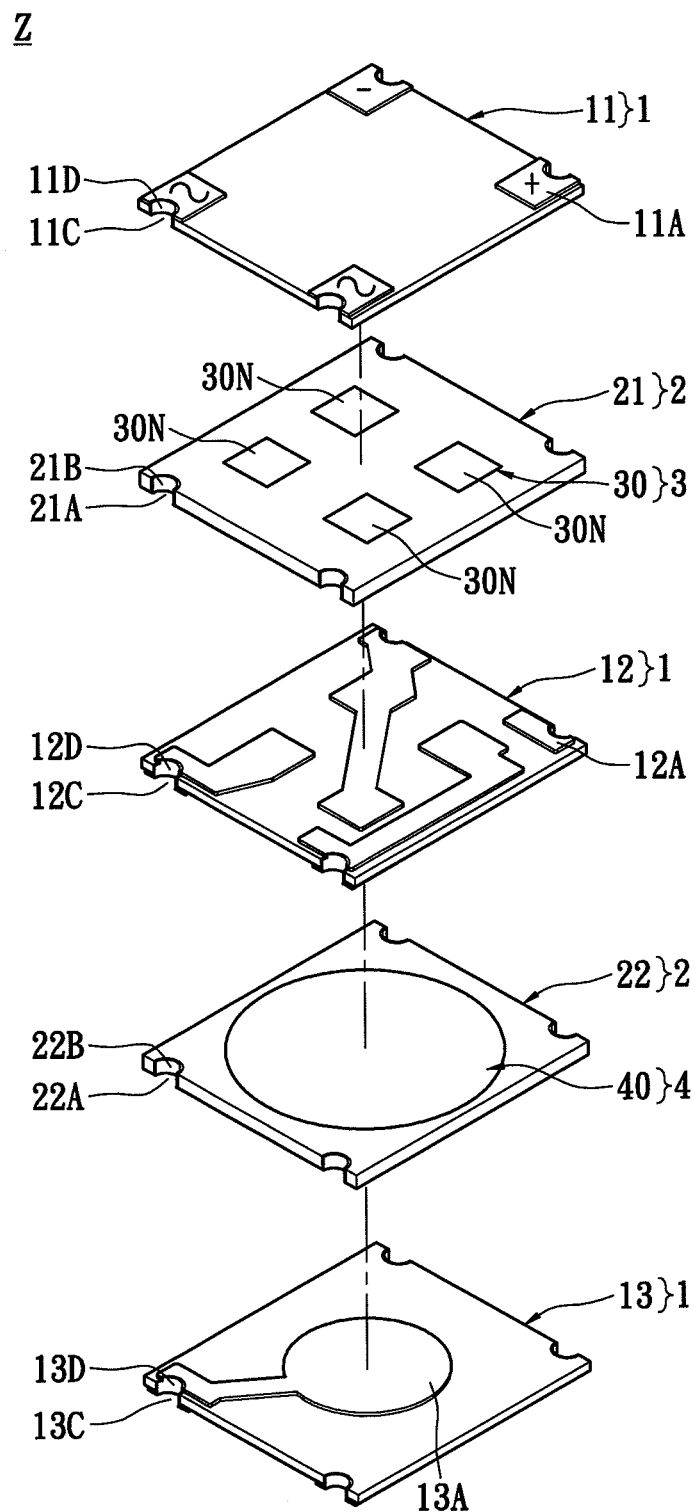
FIG. 2A is one perspective, exploded view of the multi-layer semiconductor element package structure with surge protection function according to the first embodiment of the present invention.
Figure 2B:
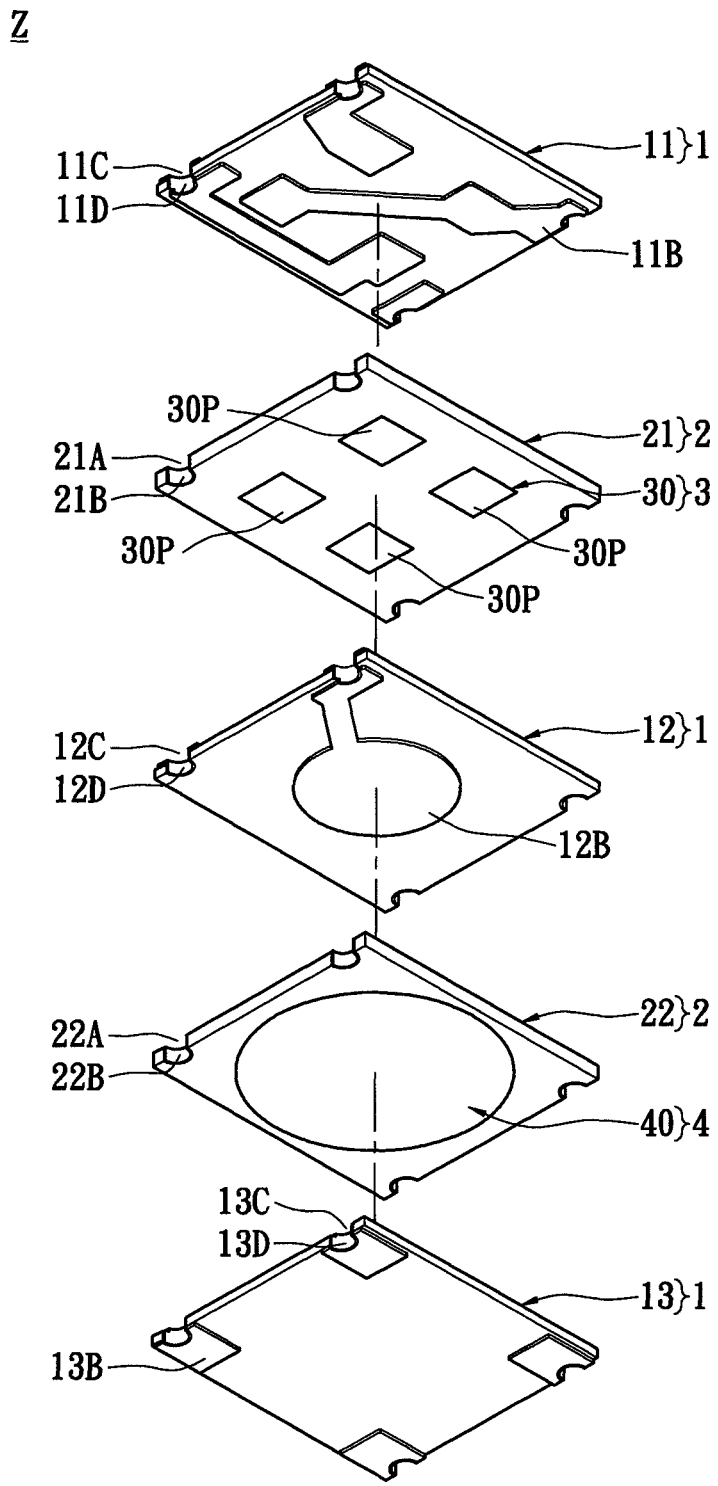
FIG. 2B is another perspective, exploded view of the multi-layer semiconductor element package structure with surge protection function according to the first embodiment of the present invention.

Referring to FIGS. 2A and 2B, the first embodiment of the present invention provides a multi-layer semiconductor element package structure with surge protection function, and the assembled structure of the multi-layer semiconductor element package structure of the first embodiment is shown as FIG. 1D. The multi-layer semiconductor element package structure Z includes a substrate unit 1, an insulated unit 2, a one-way conduction unit 3 and a protection unit 4.

The substrate unit 1 has at least one top substrate 11, at least one middle substrate 12 and at least one bottom substrate 13. For example, the at least one top substrate 11 has a plurality of top conductive pads 11A disposed on a top surface thereof, and the at least one top substrate 11 has a plurality of top conductive tracks 11B disposed on a bottom surface thereof. The at least one middle substrate 12 has a plurality of first middle conductive tracks 12A disposed on a top surface thereof, and the at least one middle substrate 12 has a plurality of second middle conductive tracks 12B disposed on a bottom surface thereof. The at least one bottom substrate 13 has a plurality of bottom conductive tracks 13A disposed on a top surface thereof, and the at least one bottom substrate 13 has a plurality of bottom conductive pads 13B disposed on a bottom surface thereof.

Moreover, the insulated unit 2 has at least one first insulated layer 21 filled between the at least one top substrate 11 and the at least one middle substrate 12 and has at least one second insulated layer 22 filled between the at least one middle substrate 12 and the at least one bottom substrate 13. In addition, the at least one top substrate 11, the at least one first insulated layer 21, the at least one middle substrate 12, the at least one second insulated layer 22 and the at least one bottom substrate 13 are stacked onto each other in sequence from top to bottom.

In addition, the at least one top substrate 11 has a plurality of first half holes 11C formed on a lateral side thereof, the at least one first insulated layer 21 has a plurality of second half holes 21A formed on a lateral side thereof and corresponding to the first half holes 11C, the at least one middle substrate 12 has a plurality of third half holes 12C formed on a lateral side thereof and corresponding to the second half holes 21A, the at least one second insulated layer 22 has a plurality of fourth half holes 22A formed on a lateral side thereof and corresponding to the third half holes 12C, and the at least one bottom substrate 13 has a plurality of fifth half holes 13C formed on a lateral side thereof and corresponding to the fourth half holes 22A. In other words, each first half hole 11C, each second half hole 21A, each third half hole 12C, each fourth half hole 22A and each fifth half hole 13C are connected to each other to form each through hole P.

Besides, the at least one top substrate 11 has a plurality of first conductive layers 11D respectively formed on inner surfaces of the first half holes 11C, the at least one first insulated layer 21 has a plurality of second conductive layers 21B respectively formed on inner surfaces of the second half holes 21A and respectively connected to the first conductive layers 11D, the at least one middle substrate 12 has a plurality of third conductive layers 12D respectively formed on inner surfaces of the third half holes 12C and respectively connected to the second conductive layers 21B, the at least one second insulated layer 22 has a plurality of fourth conductive layers 22B respectively formed on inner surfaces of the fourth half holes 22A and respectively connected to the third conductive layers 12D, the at least one bottom substrate 13 has a plurality of fifth conductive layers 13D respectively formed on inner surfaces of the fifth half holes 13C and respectively connected to the fourth conductive layers 22B. In other words, each the first conductive layer 11D, each second conductive layer 21B, each third conductive layer 12D, each fourth conductive layer 22B and each fifth conductive layer 13D are connected to each other to form each conductive layer C.

Furthermore, the one-way conduction unit 3 has a plurality of one-way conduction elements 30 (such as diodes) electrically disposed between the at least one top substrate 11 and the at least one middle substrate 12 and enclosed by the at least one first insulated layer 21. In addition, each one-way conduction element 30 is selectively electrically connected between one of the top conductive tracks 11B and one of the first middle conductive tracks 12A.

Moreover, the protection unit 4 has at least one protection element 40 (such as varistor) with anti surge current or anti surge voltage function electrically disposed between the at least one middle substrate 12 and the at least one bottom substrate 13 and enclosed by the at least one second insulated layer 22. In addition, the at least one protection element 40 is electrically connected between one of the second middle conductive tracks 12B and one of the bottom conductive tracks 13A.

Figure 3:
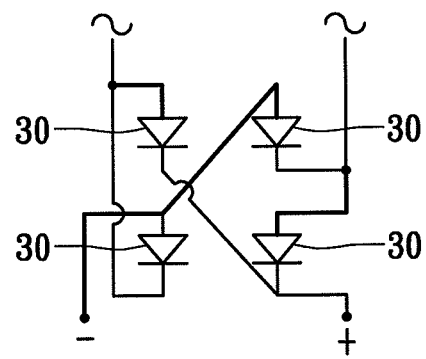
FIG. 3 is a circuit schematic diagram of the multi-layer semiconductor element package structure with surge protection function according to the first embodiment of the present invention.

Referring to FIGS. 2A, 2B and 3, the first embodiment provides four one-way conduction elements 30 (each one-way conduction element 30 has a negative side 30N and a positive side 30P respectively disposed on a top surface and a bottom surface thereof) and a protection element 40 with anti surge current or anti surge voltage function that are electrically connected to each other in order to form a bridge rectifier as shown in FIG. 3. In addition, FIG. 3 shows two alternating sides (~) and two electrode sides (+, −), the thin lines mean the top conductive tracks 11B of the top substrate 11, the heavy lines mean the first middle conductive tracks 12A of the middle substrate 12, the black spots are the conductive layers C that are conducted between the top conductive tacks 11B of the top substrate 11 and the first middle conductive tracks 12A of the middle substrate 12, and the protection element 40 and the two alternating sides are electrically mated to form a parallel configuration.

Figure 4A:
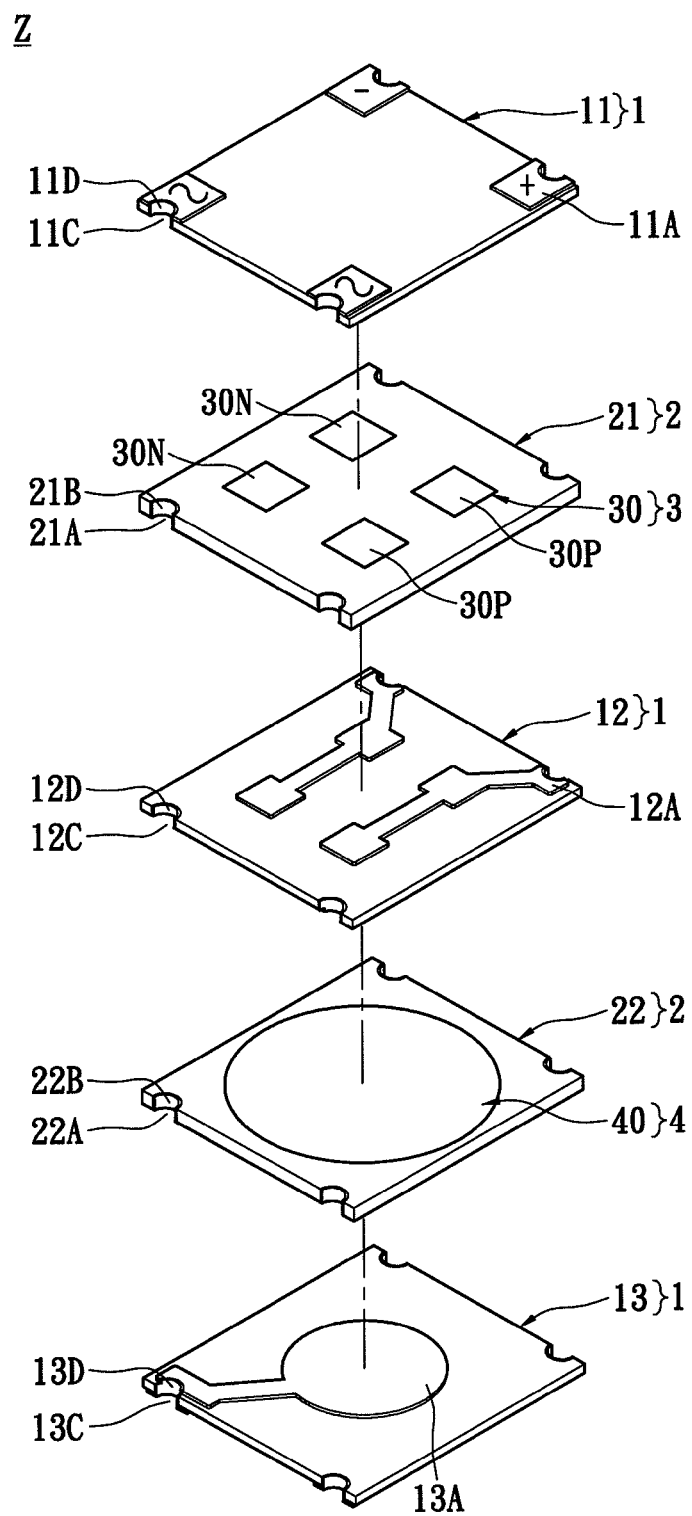
FIG. 4A is one perspective, exploded view of the multi-layer semiconductor element package structure with surge protection function according to the second embodiment of the present invention.
Figure 4B:
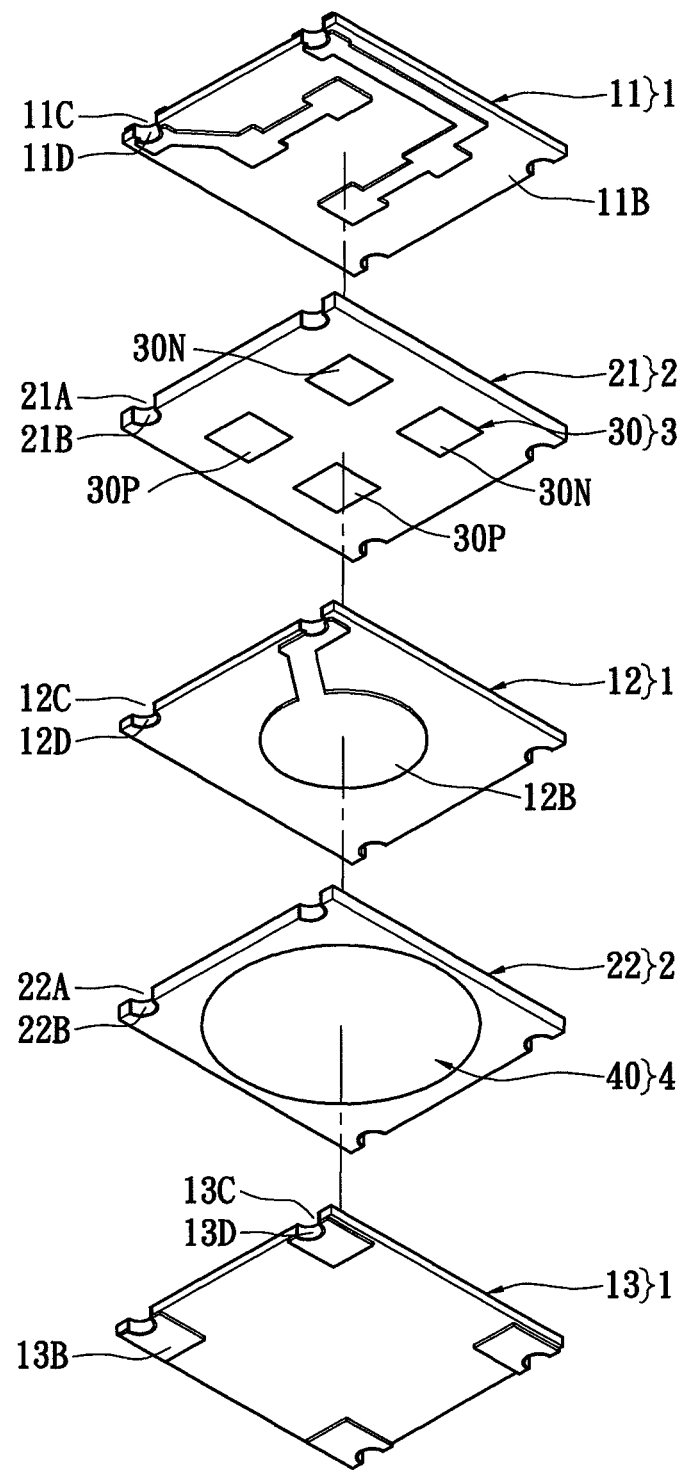
FIG. 4B is another perspective, exploded view of the multi-layer semiconductor element package structure with surge protection function according to the second embodiment of the present invention.

Referring to FIGS. 4A and 4B, the second embodiment of the present invention provides a multi-layer semiconductor element package structure with surge protection function, and the assembled structure of the multi-layer semiconductor element package structure of the second embodiment is shown as FIG. 1D. The multi-layer semiconductor element package structure Z includes a substrate unit 1, an insulated unit 2, a one-way conduction unit 3 and a protection unit 4. The difference between the second embodiment and the first embodiment is that: in the second embodiment, the top conductive tracks 11B and the first middle conductive tracks 12A show another type of circuit layout different from the first embodiment. In addition, each of two one-way conduction elements 30 has a negative side 30N and a positive side 30P respectively disposed on the top surface and the bottom surface thereof, and each of another two one-way conduction elements 30 has a positive side 30P and a negative side 30N respectively disposed on the top surface and the bottom surface thereof.

Figure 5:
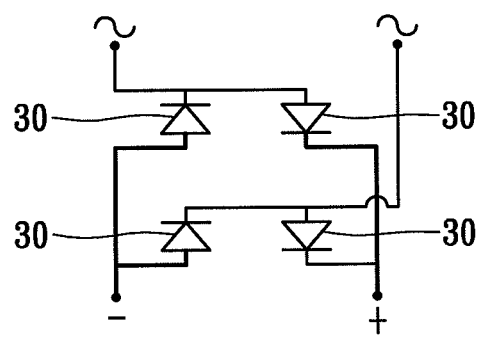
FIG. 5 is a circuit schematic diagram of the multi-layer semiconductor element package structure with surge protection function according to the second embodiment of the present invention.

Referring to FIGS. 4A, 4B and 5, the second embodiment provides four one-way conduction elements 30 and a protection element 40 with anti surge current or anti surge voltage function that are electrically connected to each other in order to form a bridge rectifier as shown in FIG. 5. In addition, FIG. 5 shows two alternating sides (~) and two electrode sides (+, −), the thin lines mean the top conductive tracks 11B of the top substrate 11, the heavy lines mean the first middle conductive tracks 12A of the middle substrate 12, the black spots are the conductive layers C that are conducted between the top conductive tacks 11B of the top substrate 11 and the first middle conductive tracks 12A of the middle substrate 12, and the protection element 40 and the two alternating sides are electrically mated to form a parallel configuration.

Figure 6:
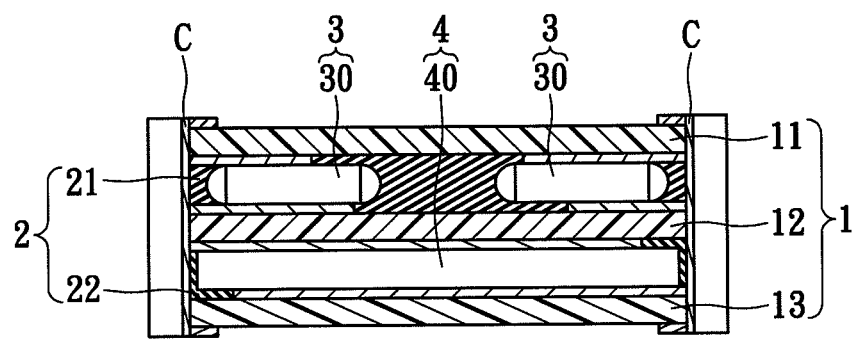
FIG. 6 is a cross-sectional, schematic view of the multi-layer semiconductor element package structure with surge protection function according to the present invention.

Referring to FIG. 6, there is a receiving space shown between the top substrate 11 and the middle substrate 12 for receiving the one-way conduction elements 30 that are enclosed by the first insulated layer 12, there is another receiving space shown between the middle substrate 12 and the bottom substrate 13 for receiving the protection elements 40 that are enclosed by the second insulated layer 22, so that the present invention can manufacture the multi-layer semiconductor element package structure with surge protection function.

Moreover, if the substrate unit 1 is composed of at least three circuit substrates (such as the top substrate 11, the middle substrate 12 and the bottom substrate 13), the present invention can provides two receiving spaces for receiving the one-way conduction elements 30 and the protection elements 40, respectively. In other words, if the substrate unit 1 is composed of more than three circuit substrates, the present invention can provide more than two receiving spaces for receiving the one-way conduction elements 30 and the protection elements 40.

In conclusion, there is a receiving space shown between the top substrate and the middle substrate for receiving the one-way conduction elements that are enclosed by the first insulated layer, and there is another receiving space shown between the middle substrate and the bottom substrate for receiving at least one of the protection elements that is enclosed by the second insulated layer, so that the present invention can solve the problems in the related art.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. A multi-layer semiconductor element package structure, comprising:
   a substrate unit having at least one top substrate, at east one middle substrate and at least one bottom substrate;
   an insulated unit having at least one first insulated layer filled between the at least one top substrate and the at least one middle substrate and at least one second insulated layer filled between the at least one middle substrate and the at least one bottom substrate;
   a one-way conduction unit having a plurality of one-way conduction elements electrically disposed between the at least one top substrate and the at least one middle substrate and enclosed by the at least one first insulated layer; and
   a protection unit having at least one protection element with anti surge current or anti surge voltage function electrically disposed between the at least one middle substrate and the at least one bottom substrate and enclosed by the at least one second insulated layer;
   wherein the at least one top substrate has a plurality of first half holes formed on a lateral side thereof, the at least one first insulated layer has a plurality of second half holes formed on a lateral side thereof and corresponding to the first half holes, the at least one middle substrate has a plurality of third half holes formed on a lateral side thereof and corresponding to the second half holes, the at least one second insulated layer has a plurality of fourth half holes formed on a lateral side thereof and corresponding to the third half holes, and the at least one bottom substrate has a plurality of fifth half holes formed on a lateral side thereof and corresponding to the fourth half holes.

2. The multi-layer semiconductor element package structure according to claim 1, wherein the at least one top substrate, the at least one first insulated layer, the at least one middle substrate, the at least one second insulated layer and the at least one bottom substrate are stacked onto each other in sequence.

3. The multi-layer semiconductor element package structure according to claim 1, wherein the at least one top substrate has a plurality of top conductive pads and a plurality of top conductive tracks respectively disposed on a top surface and a bottom surface thereof, the at least one middle substrate has a plurality of first middle conductive tracks and a plurality of second middle conductive tracks respectively disposed on a top surface and a bottom surface thereof, and the at least one bottom substrate has a plurality of bottom conductive tracks and a plurality of bottom conductive pads respectively disposed on a top surface and a bottom surface thereof.

4. The multi-layer semiconductor element package structure according to claim 3, wherein each one-way conduction element is selectively electrically connected between one of the top conductive tracks and one of the first middle conductive tracks, and the at least one protection element is electrically connected between one of the second middle conductive tracks and one of the bottom conductive tracks.

5. The multi-layer semiconductor element package structure according to claim 1, wherein the at least one top substrate has a plurality of first conductive layers respectively formed on inner surfaces of the first half holes, the at least one first insulated layer has a plurality of second conductive layers respectively formed on inner surfaces of the second half holes and respectively connected to the first conductive layers, the at least one middle substrate has a plurality of third conductive layers respectively formed on inner surfaces of the third half holes and respectively connected to the second conductive layers, the at least one second insulated layer has a plurality of fourth conductive layers respectively formed on inner surfaces of the fourth half holes and respectively connected to the third conductive layers, the at least one bottom substrate has a plurality of fifth conductive layers respectively formed on inner surfaces of the fifth half holes and respectively connected to the fourth conductive layers.

6. A multi-layer semiconductor element package structure, comprising:
   a substrate unit having at least one top substrate, at least one middle substrate and at least one bottom substrate;
   an insulated unit having at least one first insulated layer filled between the at least one top substrate and the at least one middle substrate and at least one second insulated layer filled between the at least one middle substrate and the at least one bottom substrate;
   a one-way conduction unit having a plurality of diodes electrically disposed between the at least one top substrate and the at least one middle substrate and enclosed by the at least one first insulated layer; and
   a protection unit having at least one protection element with anti surge current or anti surge voltage function electrically disposed between the at least one middle substrate and the at least one bottom substrate and enclosed by the at least one second insulated layer;
   wherein the at least one top substrate has a plurality of first half holes formed on a lateral side thereof, the at least one first insulated layer has a plurality of second half holes formed on a lateral side thereof and corresponding to the first half holes, the at least one middle substrate has a plurality of third half holes formed on a lateral side thereof and corresponding to the second half holes, the at least one second insulated layer has a plurality of fourth half holes formed on lateral side thereof and corresponding to the third half holes, and the at least one bottom substrate has a plurality of fifth half holes formed on a lateral side thereof and corresponding to the fourth half holes.

7. The multi-layer semiconductor element package structure according to claim 6, wherein the number of the diodes is four, and the four diodes are electrically connected with each other to form a bridge rectifier.

8. The multi-layer semiconductor element package structure according to claim 6, wherein the at least one top substrate, the at least one first insulated layer, the at least one middle substrate, the at least one second insulated layer and the at least one bottom substrate are stacked onto each other in sequence.

9. The multi-layer semiconductor element package structure according to claim 6, wherein the at least one top substrate has a plurality of top conductive pads and a plurality of top conductive tracks respectively disposed on a top surface and a bottom surface thereof, the at least one middle substrate has a plurality of first middle conductive tracks and a plurality of second middle conductive tracks respectively disposed on a top surface and a bottom surface thereof, and the at least one bottom substrate has a plurality of bottom conductive tracks and a plurality of bottom conductive pads respectively disposed on a top surface and a bottom surface thereof.

10. The multi-layer semiconductor element package structure according to claim 9, wherein each diode is selectively electrically connected between one of the top conductive tracks and one of the first middle conductive tracks, and the at least one protection element is electrically connected between one of the second middle conductive tracks and one of the bottom conductive tracks.

11. The multi-layer semiconductor element package structure according to claim 6, wherein the at least one top substrate has a plurality of first conductive layers respectively formed on inner surfaces of the first half holes, the at least one first insulated layer has a plurality of second conductive layers respectively formed on inner surfaces of the second half holes and respectively connected to the first conductive layers, the at least one middle substrate has a plurality of third conductive layers respectively formed on inner surfaces of the third half holes and respectively connected to the second conductive layers, the at least one second insulated layer has a plurality of fourth conductive layers respectively formed on inner surfaces of the fourth half holes and respectively connected to the third conductive layers, the at least one bottom substrate has a plurality of fifth conductive layers respectively formed on inner surfaces of the fifth half holes and respectively connected to the fourth conductive layers.

* * * * *